(12) United States Patent
McDonald, II et al.

(10) Patent No.: US 6,940,356 B2
(45) Date of Patent: Sep. 6, 2005

(54) CIRCUITRY TO REDUCE PLL LOCK ACQUISITION TIME

(75) Inventors: James J. McDonald, II, Gorham, ME (US); Ronald B. Hulfachor, Nashua, NH (US)

(73) Assignee: Fairchild Semiconductor Corporation, South Portland, ME (US)

( * ) Notice: Subject to any disclaimer, the term of this patent is extended or adjusted under 35 U.S.C. 154(b) by 11 days.

(21) Appl. No.: 10/780,493

(22) Filed: Feb. 17, 2004

(65) Prior Publication Data

US 2004/0160281 A1 Aug. 19, 2004

Related U.S. Application Data

(60) Provisional application No. 60/447,423, filed on Feb. 14, 2003.

(51) Int. Cl.[7] ................................................. H03L 7/00
(52) U.S. Cl. .................................. 331/16; 331/DIG. 2
(58) Field of Search ........................... 331/14, 16, 17, 331/25, 175, DIG. 2; 327/148, 157, 146, 155, 156; 375/375, 376, 373

(56) References Cited

U.S. PATENT DOCUMENTS

| 4,745,372 | A | | 5/1988 | Miwa | 331/17 |
| 5,675,292 | A | | 10/1997 | McCune, Jr. | 331/17 |
| 5,821,818 | A | * | 10/1998 | Idei et al. | 331/17 |
| 5,942,949 | A | | 8/1999 | Wilson et al. | 331/17 |
| 6,097,227 | A | | 8/2000 | Hayashi | 327/158 |
| 6,476,681 | B1 | | 11/2002 | Kirkpatrick | 331/17 |
| 6,504,437 | B1 | | 1/2003 | Nelson et al. | 331/114 |
| 6,549,079 | B1 | | 4/2003 | Crook | 331/17 |
| 6,747,521 | B1 | * | 6/2004 | Allott | 331/175 |

FOREIGN PATENT DOCUMENTS

| EP | 0 528 651 A | 2/1993 |
| WO | WO 96/29785 A | 9/1996 |

* cited by examiner

*Primary Examiner*—Linh My Nguyen
(74) *Attorney, Agent, or Firm*—Cesari and McKenna, LLP; Edwin H. Paul, Esq.

(57) ABSTRACT

A phase locked loop, PLL, is described with multiple parallel charge pumps that are selectively disabled as phase lock is approached. A lock detection circuit is described that enabled reference currents to be fed to the parallel charge pumps. The error signal from a phase detector is arranged as UP and a DOWN signals that are averaged in the lock detector. When the average error is large, all the reference currents feed the charge pumps that provide a high loop gain to reduce the lock time. As the lock becomes closer selective reference currents are disabled to reduce loop gain so that a smooth transition to lock is made. Selectively switching currents into a low pass filter that usually follows a charge pump in a PLL circuit automatically reduces switching noise by the operation of the low pass filter.

13 Claims, 4 Drawing Sheets

CIRCUITRY TO REDUCE PLL LOCK ACQUISITION TIME

CROSS-REFERENCE TO RELATED APPLICATIONS

The present application claims the benefit of U.S. Provisional Patent Application Ser. No. 60/447,423, which was filed on Feb. 14, 2003, of common title, inventorship and ownership, and which provisional application is hereby incorporated herein by reference.

BACKGROUND OF THE INVENTION

1. Field of the Invention

This invention relates to a digital phase lock loop. More particularly it relates to a phase lock loop in which the effective loop gain and bandwidths are varied in accordance with the frequency/phase error.

2. Background Information

The invention is directed to digital phase lock loops commonly incorporated in large-scale integrated circuits. The operations performed by these circuits are synchronized to the output of a local clock and the clock in turn is often synchronized to an external reference clock so as to synchronize the operations of the circuit to those of other devices in a system that includes the circuit. To accomplish the latter synchronization the local clock is configured as a voltage-controlled oscillator (VCO) whose output is compared with the external reference signal in a frequency/phase detector. The output of the detector is an error signal that is applied to a low-pass filter that serves as an error integrator. The output of the filter drives the VCO.

The bandwidth (and the related time constant) of the filter is often a compromise between two conflicting requirements. Specifically, when the frequency/phase error of the local oscillator is large, a short filter time constant is desirable so that the filter output rapidly reflects changes in the error signal, thereby facilitating rapid adjustment (or acquisition) of the oscillator frequency with respect to the reference signal. On the other hand, when the oscillator output is close to the frequency and phase of the reference, a long time constant is desirable in order to provide loop stability and immunity from noise and other short-term perturbations.

It has been suggested that the filter bandwidth can be changed in accordance with the magnitude of the frequency/phase error. Specifically, different resistors or capacitors can be switched into or out of the filter to provide a large or narrow bandwidth or narrow bandwidth as desired. However, the switching of components into and out of the filter circuit is a source of undesirable noise in the filter output, resulting from the sudden change in filter parameters perturbations and noise coupled through the typically used MOSFET switch that connects or disconnects these components.

Other prior art attempts may be found in U.S. Pat. Nos.: 6,504,437 ('437); 6,476,681 ('681); 5,942,949 ('949); and 5,675,292 ('292). The '437 patent is entitled, "Low-noise Fast Lock Loop with Gearshifting Control," and discloses switching filter components. The '681 patent is entitled, "Adjustable Bandwidth PLL with Fast Settling Time," and switches in additional filter components. The '949 patent is entitled, "Self Calibrating PLL with Auto Trim Operations for Selecting Oscillator Operative Curve," and discloses changing the VCO gains along with filter components. The '292 patent is entitled, "PLL Enabling Smooth Loop Bandwidth Switching over a Wide Range," and also switched filter components that change current sources into voltage sources to control bandwidth. These U.S. patents are incorporated herein by reference.

It is an objective of the present invention to provide for a fast acquisition lock of the VCO to a references frequency signal without compromising system stability or introducing switching noise.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

SUMMARY OF THE INVENTION

In view of the foregoing background discussion, the present invention provides a phase lock loop employing multiple charge pumps, connected in parallel, to supply the input current of the low-pass filter in the PLL loop. When the magnitude of the oscillator frequency/phase error is large, all of the charge pumps are enabled driving reasonably high currents into the low pass filter, resulting in a relatively high loop gain. This provides a high slew rate for the oscillator control voltage to rapidly change the VCO output frequency to decrease the frequency/phase error and therefore provide a rapid frequency acquisition lock. As the error decreases, successive charge pumps are disabled until, with minimal error only a single pump supplies current to the filter. With this arrangement a filter with a fixed, narrow bandwidth can be used to provide both a fast loop response when the error is large and a slow response when the oscillator phase closely tracks the reference signal and any errors are small.

Advantageously, the noise that is characteristic of phase lock loops in which filter components are switched into and out of the circuit is materially reduced by the present invention. Specifically, the noise involved in switching from one loop gain to another as the charge pumps are enabled or disabled is generated on the input side of the filter rather than within the filter itself. In such an instance, the switching noise generated is subject to and thus attenuated by the filter itself. Additionally, the outputs of the charge pump are typically three stated, and, so, when switched in or out do not carry a significant charge that would produce switching noise. The present invention virtually eliminates switching perturbations compared to those caused by switching filter components into and out of the circuit.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
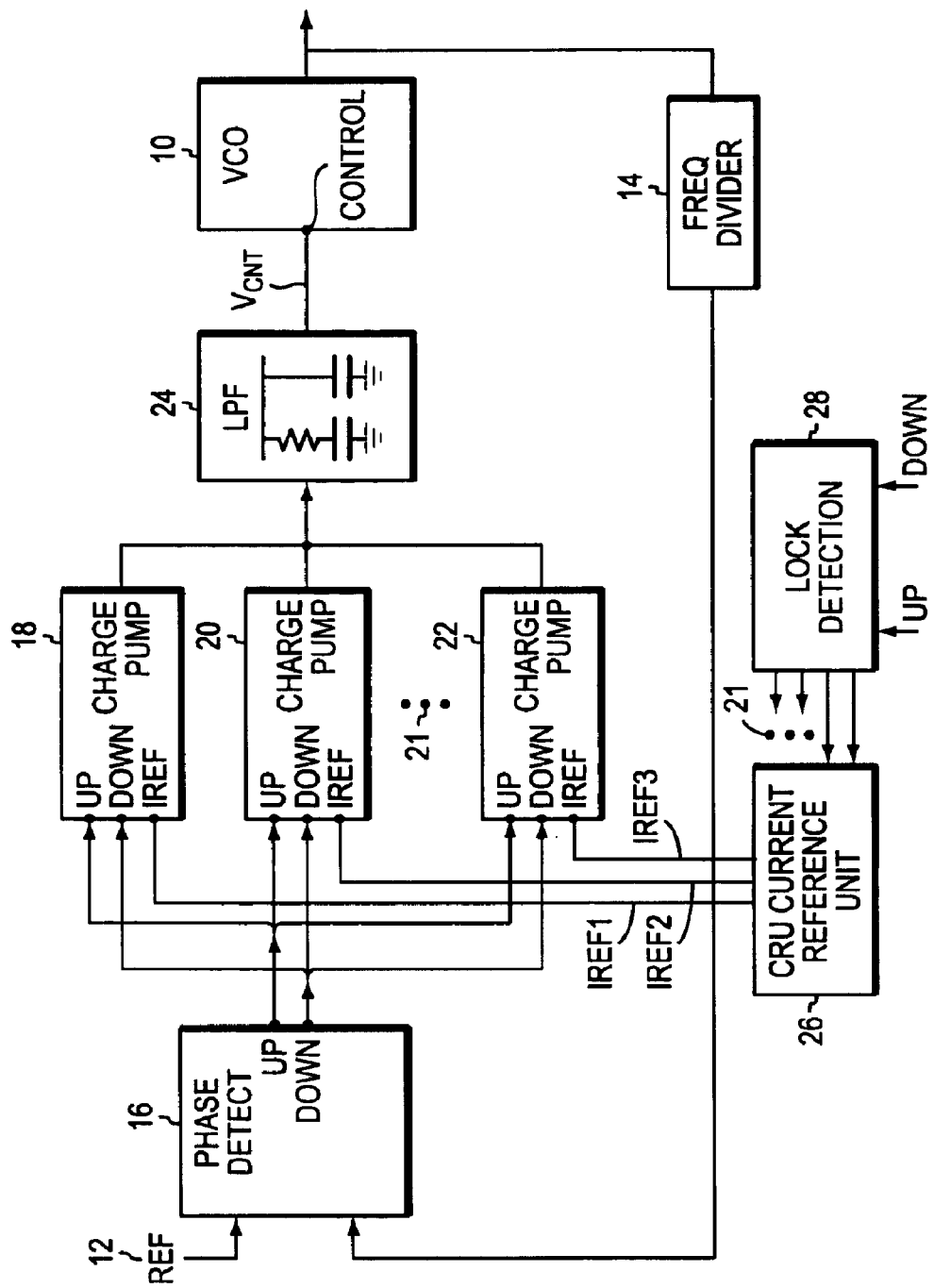
FIG. 1 is a schematic diagram of a phase lock embodying the invention.

As shown in FIG. 1, a phase lock loop incorporating the invention includes a voltage-controlled oscillator (VCO) 10 whose output is to be phase-locked to a reference signal from a reference source 12. The output of the VCO 10 is applied to a frequency divider 14 whose output, in turn, is applied to the phase detector 16 that compares the frequency and phase of the divider 14 output with the frequency and phase of the reference signal 12. The output of detector 16 is an error signal, in this case separate UP and DOWN signals, that cause charge pumps 18, 20, 22 and any others 21 to deliver charge to, or remove charge from, a lower pass filter (LPF) 24. The output of the LPF 24 drives the VCO 10.

The circuit details of the phase detector, the low pass filter and the VCO are well known in the art and will be left in block form. For more information on these blocks see, for example, virtually any application note on the subject from many sources and the prior U.S. patents cited above. The details of the charge pumps, the lock detector and the current reference units are more fully described below.

More specifically, the detector 16 asserts an UP or DOWN signal depending on whether the oscillator frequency is to be increased or decreased order to decrease the frequency/phase error of the oscillator 10. These signals are binary inverses of each other and periodic having the frequency of the reference signal and duty cycles that depend on the magnitude of the phase error.

The charge pumps 18–22 are essentially constant-current sources. When enabled, each of the charge pumps delivers current to the filter 24, the direction of the current, depending on whether the charge pump receives an UP signal or a DOWN signal from the phase detector 16. The magnitude of the output current of each charge pump is governed by an IREF signal provided by a current reference unit (CRU) 26. The CRU 26 may provide the same reference signal to all of the charge pumps or, as shown in FIG. 1, provide different reference signals to some or all of the charge pumps, depending on the desired characteristics of the phase lock loop. When the same signal IREF is fed to all charge pumps the circuitry, typically CMOS, is scaled to provide the desired currents from the charge pumps. Such scaling, typically of CMOS current mirror channel widths and lengths, is well known in the art.

In one embodiment, the charge pump 18 is enabled to operate continuously providing a very fine lock with respect to the UP and DOWN signals. The charge pumps 20 and 22, on the other hand, operate only when enabled by a lock detection unit 28 via a current reference unit 26. The ellipses 21 indicate that a number of scaled charge pumps and lock detector circuits may be employed so that the transition to the locked state occurs smoothly. The more charge pumps with incrementally scaled currents will provide a more smooth transition to a locked state.

Figure 2:
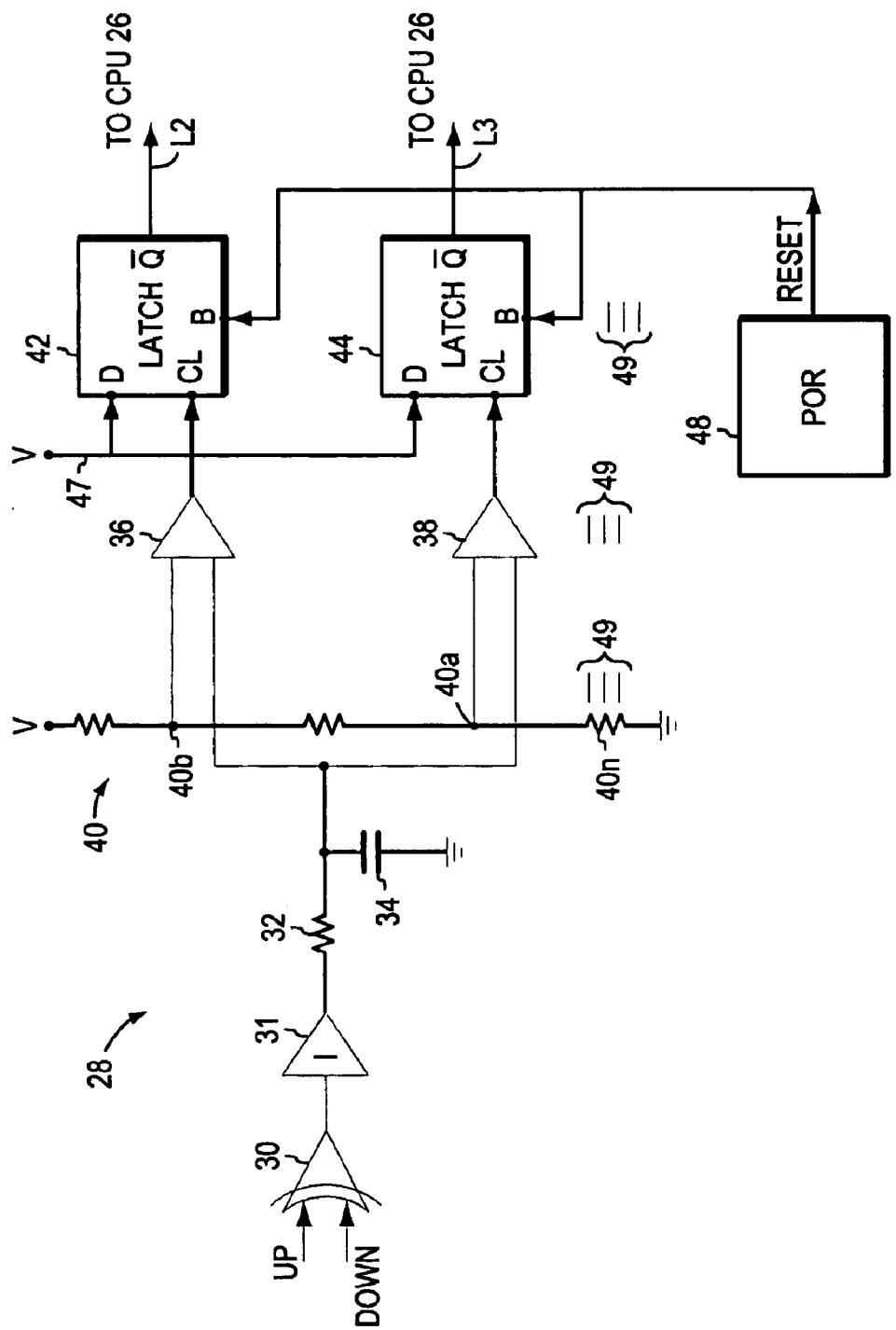
FIG. 2 is a diagram of a lock detection unit used in the phase lock loop.

As shown in FIG. 2, the lock detection unit 28 includes an exclusive-or (XOR) gate 30 that receives the UP and DOWN signals from the phase detector 16. The output of the gate 30 is applied an inverter 31 driving a low-pass filter of resistor 32 and shunt capacitor 34. The voltage on the capacitor 34 serves as one input to each of the voltage comparators 36 and 38. The comparators compare this voltage with the voltages present at taps 40a and 40b on the voltage divider 40. The outputs of the comparators 36 and 38 are applied to the clock input terminals of D type latches (flip flops) 42 and 44, whose data inputs are continuously asserted 47. Again there may be other latches and circuitry as indicated by the ellipses 49. Also, many other combination of logic circuitry, JK flops, AND, OR and NOT gates, etc., may used to achieve comparable results as is well known in the art.

When the power is first turned on the voltage on the capacitor 34 is zero and neither comparators 36 and 38, as arranged, assert an output signal. But, assuming a substantial frequency error in the output of the oscillator 10, the UP or the DOWN input to the XOR gate 30 will have a 100 percent duty cycle, as will the gate 30 output. The inverter 31 will thus supply zero voltage to the low pass filter. The outputs of the latches 42 and 44 are reset by the power on reset, POR 48, such that the reset output signals L2 and L3 to the CRU will be high and turn on all the IREF's current sources. These on current sources activate the charge pumps collectively to drive the maximum current available, as discussed herein, into the LPF 24 of FIG. 1. This arrangement provides the highest loop gain for the phase locked loop.

As the frequency/phase error of the oscillator 10 decreases, the duty cycle of the error signal from the phase detector 16 decreases, with a corresponding increase of the duty cycle (that is there will be a signal) of the output of the inverter 31 and an increase in the voltage on the capacitor 34. At a predetermined threshold, the voltage of the capacitor will exceed the voltage at voltage divider tap 40a and the comparator 38 will provide a clocking input to the latch 44, which will thereby be latched to its ON state. The latch reset output will go low and disable the reference current source in the CRU 26 that supplies the IREF signal to the charge pump 22, thereby turning off that charge pump. Similarly, as the error decreases further, the corresponding increase in voltage on the capacitor 34 will cause the comparator 36 to provide a clock input to the latch 42 and thereby latch that flip flop to its ON state. The latch 42 reset output will disable another current source in the current reference unit to turn off the charge pump 20, thereby leaving on only charge pump 18 operating at the finest lock condition for the particular circuit.

The foregoing latch arrangement largely immunizes the phase-lock loop from the effects of overshoot. With the high loop gain (all multiple charge pumps on) an over-shoot may result in a damped oscillation of the VCO output, thereby delaying phase lock. Any negative phases of an overshoot may trigger and UP/DOWN reversal that may trigger the comparators in the LOCK DETECTOR 28. However, the inclusion of the latches (42, 44) maintain the state of the latches and therefore of the charge pumps. So the reduced loop gain is maintained quickly reducing any overshoot. Note that the latches42 and 44 are optional and only aid in decreasing the lock time.

The latches 42 and 44 are initially reset by a power-on signal (POR) that is generated by a POR circuit 48 when the system is turned on. They are also reset by a signal from the comparator 38, if the phase/frequency error of the oscillator 10 exceeds an arbitrary threshold. To accomplish this, the inverted output of the comparator 38 is applied to the POR circuit.

Figure 3:
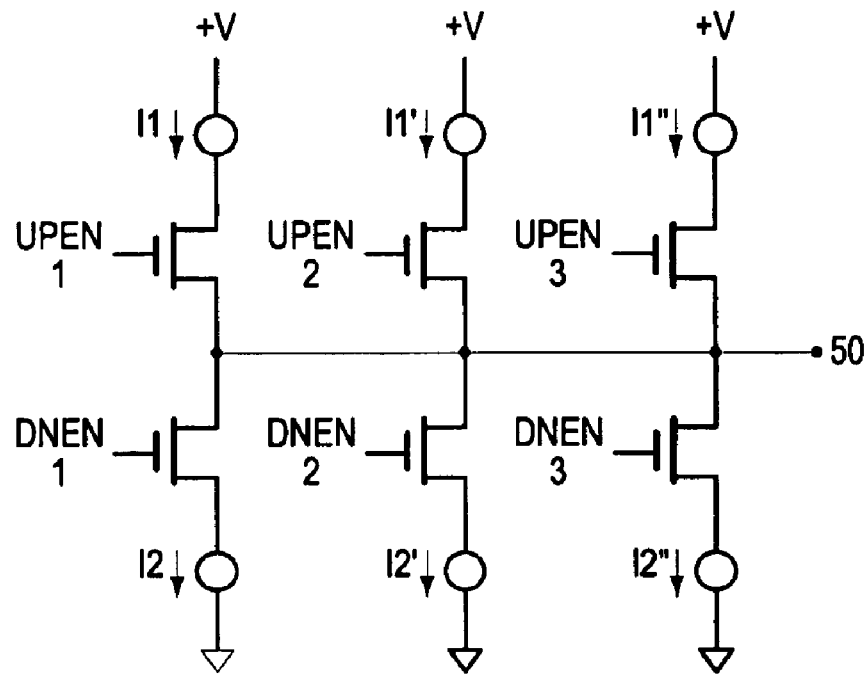
FIG. 3 is a functional schematic of the charge pumps.

FIG. 3 shows an overview of several charge pumps driving either a positive of a negative current into a low pass filter. As evident when all three UPEN 1, 2 and 3 are on I1, I1', and I1" will all drive the OUT signal 50. Similar operation when the DNEN1, 2 and 3 are all on where I2, I2' and I2" will sink current from the OUT signal 50. As the error signal is reduced, the enable signals will remove the currents from the OUT signal in turn making a smooth transition to a locked state. In a preferred embodiment the charge pump supplying the least current (the finest lock state of the PLL) is always on supplying or sinking current from the LPF 24 as determined from the UP or DOWN error signals. The finest lock state of the PLL indicates the closest match between the feedback signal and the reference signal inputs to the phase detector 16.

Figure 4:
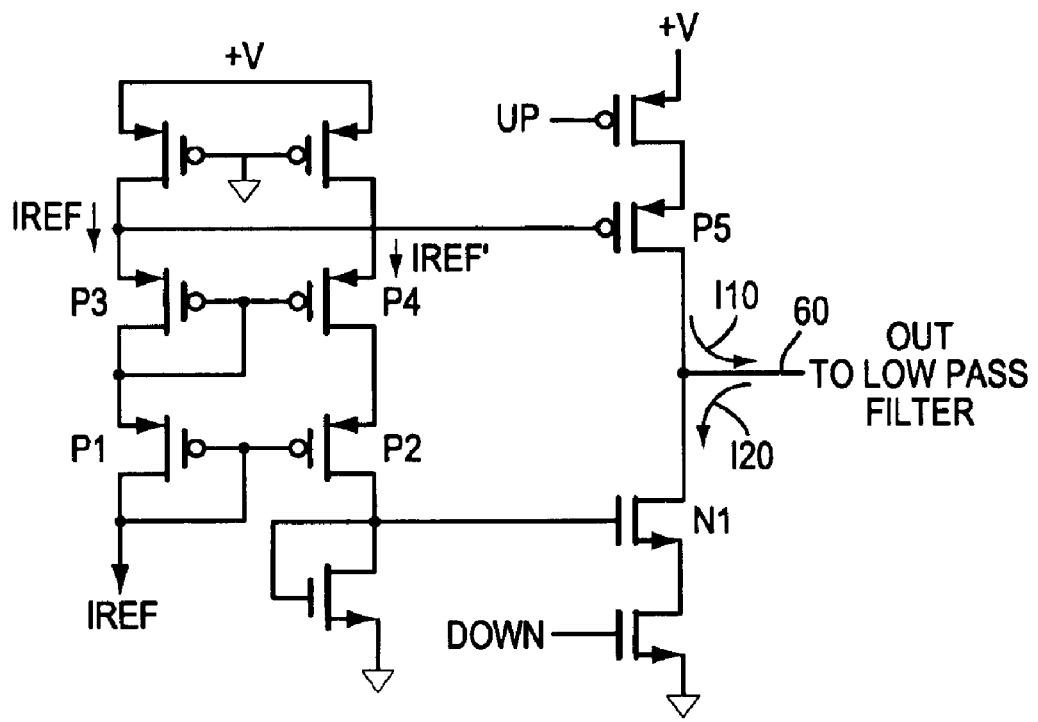
FIG. 4 is a schematic of a charge pump used in the phase lock loop.

FIG. 4 shows a preferred charge pump circuit where the OUT signal 60 drives the low pass filter. In this circuit a single IREF input comes from the CRU 26 that results in a positive current 110 or a negative current 120 out to the low pass filter depending on whether the UP 60 or DOWN 62 signal is asserted. In this circuit, IREF is mirrored via P1 and P2 producing IREF.' The input IREF travels through P3. If the transistors involved are of equal size, IREF is produced as 10 and IREF' as 120 at the OUT signal 60. As mentioned above, 10 and 120 may be scaled with respect to IREF as well known in the art or a different IREF may be input to each charge pump to effect the different currents provided to the low pass filter as discussed herein. In one preferred embodiment different IREF's are provided as discussed below for the CRU 26. The particular FIG. 4 charge pump circuitry is representative only and many other circuit configurations, as well known in the art, and as found in many technical handbooks from the major manufacturers (see list elsewhere herein), would work.

Figure 5:
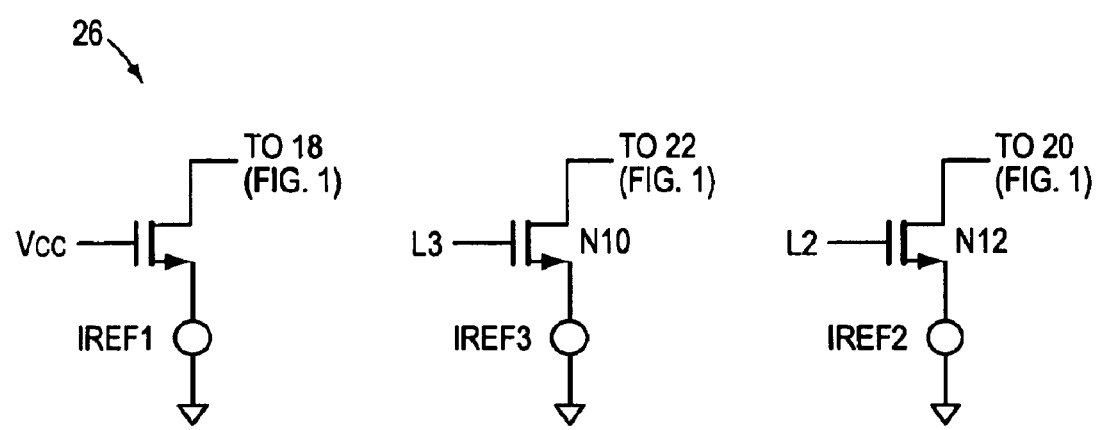
FIG. 5 is a schematic of the reference current unit.

FIG. 5 shows a preferred embodiment of the current reference unit CRU 26 with mulitple inputs from the LOCK detector 28 and multiple IREF outputs to the charge pumps. In this case, IREF1 goes to the charge pump 18 (FIG. 1) and is always on and represents the finest lock state of the PLL. L3 and L2 come from the LOCK DETECTOR 28 latches and when positive N10 and N12 transistors are on and IREF3 and IREF2 are fed to respective charge pumps, 22 and 20 in FIG. 1. As lock is approached, as judged by the charge on the capacitor 34 of the Lock DETECTOR FIG. 2, L3 will turn off N10 and disconnect IREF2—the larger more coarse control current, from charge pump 22. As lock becomes even closer L2 will turn off N12 and disconnect IREF2 from the charge pump 20. As known in the art, the IREF's current sources may be formed from on-biased CMOS transistors with characteristics, e.g. pinch off points, representing the different reference currents desired.

The above preferred embodiment circuitry embodies current references, voltage comparators, latches, CMOS transistors, current sources and current mirrors. However, as known to those skilled in the art, current comparators, voltage sources, bipolar elements, and the like may be used in addition to or replacing the circuit elements shown herein. Moreover, digitally controlled circuit elements and a controlling computer and suitable software may be substituted for many elements of FIG. 1, including, but not limited to, the filters, VCO's, current and voltage reference sources, charge pumps, phase comparators, lock detectors, charge pumps, etc.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A phase locked loop (PLL) circuit comprising:
    a phase detector comparing an input signal to a feedback signal, the phase detector providing an error signal,
    a low pass filter defining a filter output,
    a voltage controlled oscillator accepting the output from the low pass filter and output the feedback signal,
    at least two charge pumps that each a driving signal to the low pass filter,
    wherein the driving signal is responsive to the error signal,
    a lock detector that accepts the error signal and in response outputs at least one lock signal, wherein the one lock signal represents an indication of a coarse lock,
    a reference generator that accepts the lock signal and in response outputs one reference signal to one charge pump, wherein the reference signal controls the charge pump, and
    wherein when the at least two charge pumps provide a signal to the low pass filter the PLL loop bandwidth is higher than when one of the at least two charge pump is inactive.

2. The phase locked loop circuit of claim 1 wherein the at least two charge pumps are each arranged to accept a reference current and output a current to the low pass filter.

3. The phase locked loop circuit of claim 2 wherein the at least two charge pumps are each arranged to accept the same reference current but output different currents to the low pass filter.

4. The phase locked loop circuit of claim 2 wherein the at least two charge pumps are each arranged to accept different reference currents and output different currents to the low pass filter.

5. The phase locked loop circuit of claim 4 wherein the reference source comprises a a first reference current source driving one charge pump, and a second reference current source driving a second charge pump, and wherein the second reference current source is larger than the first reference current source.

6. The phase locked loop of claim 5 wherein the second current source is selected on or off by the coarse lock signal from the lock detector.

7. The phase locked loop of claim 1 wherein the first lock signal is latched.

8. The phase locked loop of claim 1 wherein the reference generator comprises:
    first, second and third reference current sources, where the first reference current source has lower magnitude than the second reference current source which has a lower magnitude than the third reference current source, and wherein the lock detector comprises at least two lock signals, a coarse lock signal that controls the third reference current source, and a second lock signal that controls the second reference current source.

9. The phase locked loop of claim 1 wherein the lock detector comprises:
    at least one comparator,
    a circuit that averages the error signal, the averaged error signal connects to an input of the at least one comparator,
    a voltage divider circuit arranged to provide a different trigger voltage to the second input of the at least one comparator, wherein when the average error signal reaches the trigger voltage of each comparator, the lock signal disables the corresponding reference current source, thereby reducing the loop gain of the phase locked loop.

10. A phase locked loop that includes a phase detector providing an error signal to a charge pump, wherein the charge pump in response outputs a current into a low pass filter that outputs a signal to a voltage controlled oscillator, whose output is divided thereby producing a feedback signal that is compared to an input signal in the phase detector, further comprising a lock detector that provides a coarse lock signal indicating that a coarse lock state has been reached for the PLL, and at least one additional charge pump that defines an output current into the low pass filter, the additional charge pump accepts and is controlled on or off by the coarse lock signal, wherein when the additional charge pump is off the loop bandwidth of the phase locked loop is lowered.

11. The phase locked loop of claim 10 further comprising additional charge pumps and lock detectors that output additional corresponding lock signals to the additional charge pumps, the additional lock signals indicating finer and finer lock conditions of the phase locked loop, wherein as the phase locked loop approaches closer to the finest lock condition, the additional lock signals incrementally turn off the corresponding charge pumps to incrementally reduce the phase locked loop bandwidth.

12. The phase locked loop of claim 10 further comprising a reference current arranged to accept the coarse lock signal and provide a reference current to the charge pump that controls the charge pump output current, wherein when the coarse lock signal is not asserted the reference current drives the charge pump to output a current to the low pass filter, and when the coarse lock signal is asserted turning off the reference current that in turn turns off the charge pump current to the low pass filter.

13. A method of operating a phase locked loop, wherein the loop contains a low pass filter with an output driving a voltage controlled oscillator that outputs a signal that is divided forming a feedback and fed back to a phase detector that compares the feedback signal to an input signal, the phase detector outputting an error signal, wherein the error signal ultimately drives a current via multiple charge pumps into the low pass filter, the method comprising the steps of:

comparing the error signal to reference levels, wherein the reference levels indicate degrees of coarser and finer lock states of the phase locked loop, wherein, in response to the error signal reaches the corresponding reference level, adjusting the current from the charge pumps so that the loop gain of the phase locked loop is reduced as finer locks are reached.

* * * * *